(12) United States Patent
Zhao et al.

(10) Patent No.: US 12,284,829 B2
(45) Date of Patent: Apr. 22, 2025

(54) ARRAY SUBSTRATE AND DISPLAY PANEL

(71) Applicant: GUANGZHOU CHINA STAR OPTOELECTRONICS SEMICONDUCTOR DISPLAY TECHNOLOGY CO., LTD., Guangdong (CN)

(72) Inventors: Jun Zhao, Guangdong (CN); Wei Wu, Guangdong (CN); Bin Zhao, Guangdong (CN); Juncheng Xiao, Guangdong (CN)

(73) Assignee: GUANGZHOU CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/754,250

(22) PCT Filed: Mar. 21, 2022

(86) PCT No.: PCT/CN2022/081973
§ 371 (c)(1),
(2) Date: Mar. 28, 2022

(87) PCT Pub. No.: WO2023/168749
PCT Pub. Date: Sep. 14, 2023

(65) Prior Publication Data
US 2024/0047467 A1    Feb. 8, 2024

(30) Foreign Application Priority Data
Mar. 10, 2022    (CN) .......................... 202210234303.4

(51) Int. Cl.
*H10D 86/60*    (2025.01)
*G02F 1/1368*   (2006.01)
*H10D 30/67*    (2025.01)
*H10D 86/40*    (2025.01)
*H10D 99/00*    (2025.01)

(52) U.S. Cl.
CPC .......... *H10D 86/60* (2025.01); *G02F 1/1368* (2013.01); *H10D 86/423* (2025.01)

(58) Field of Classification Search
CPC .......... H01L 27/1225; H01L 29/78696; H01L 29/78621; H01L 29/78624;
(Continued)

(56) References Cited

U.S. PATENT DOCUMENTS 8,872,179 B2 * 10/2014 Tsubuku ........... H01L 29/42384
257/43
9,379,251 B1 * 6/2016 Fang ................. H01L 29/66969
(Continued)

FOREIGN PATENT DOCUMENTS

| CN | 103050410 A | 4/2013 |
|----|-------------|--------|
| CN | 107204376 A | 9/2017 |

(Continued)

OTHER PUBLICATIONS

International Search Report in International application No. PCT/CN2022/081973, mailed on Dec. 5, 2022.
(Continued)

*Primary Examiner* — Herve-Louis Y Assouman
(74) *Attorney, Agent, or Firm* — PV IP PC; Wei Te Chung

(57) ABSTRACT

An array substrate and a display panel are disclosed. The display panel includes the array substrate. An ion injection stopper layer and an active layer of the array substrate correspond to at least part of the channel part. The ion injection stopper layer blocks ions from being injected into the channel part. Therefore, an effective channel length of oxide TFTs is reduced. A width of a channel of the oxide TFTs can be reduced without changing a width-length ratio
(Continued)

of the oxide TFTs. As such, a size of the oxide TFTs can be reduced, and an aperture ratio of the display panel is increased.

13 Claims, 4 Drawing Sheets

(58) Field of Classification Search
CPC ........... H01L 29/66969; H01L 29/7869; G02F 1/1368; G02F 1/1362
See application file for complete search history.

(56) References Cited

U.S. PATENT DOCUMENTS

| | | | |
|---|---|---|---|
| 2011/0042670 A1* | 2/2011 | Sato | H01L 29/78621 257/E29.296 |
| 2013/0134422 A1* | 5/2013 | Tsubuku | H01L 29/42384 257/57 |
| 2015/0236128 A1 | 8/2015 | Wang et al. | |

FOREIGN PATENT DOCUMENTS

| | | |
|---|---|---|
| CN | 107240610 A | 10/2017 |
| CN | 107464820 A | 12/2017 |
| CN | 112530810 A | 3/2021 |

OTHER PUBLICATIONS

Written Opinion of the International Search Authority in International application No. PCT/CN2022/081973, mailed on Dec. 5, 2022.

* cited by examiner

ARRAY SUBSTRATE AND DISPLAY PANEL

FIELD

The present disclosure relates to a field of display technologies, and more particularly, to an array substrate and a display panel.

BACKGROUND

Development trends of display panels are toward directions of large scale, high resolution, high frequency, and self-luminescence display mode. Therefore, mobility and stability required for thin-film transistor (TFTs) configured to turn on/off switches and drive devices to display become higher and higher. Amorphous silicon TFTs commonly used in conventional display industry has low mobility and low on-state currents, and therefore cannot satisfy requirements of high-end display products. Mobility of oxide TFTs is ten times to a hundred times as much as mobility of the amorphous silicon TFTs, satisfying requirements of new high-end display products. Thus, the oxide TFTs and display panels having thereof attract increasing attention in industry.

Regarding technical issues:

there are two types of oxide TFTs in array substrates of conventional liquid crystal display (LCDs). One is an etch stopper layer (ESL) type TFT; the other is a back channel etch (BCE) type TFT. In manufacturing processes of the ESL type TFT, an additional mask process needs to be performed to manufacture an etch stopper layer, leading to higher cost. Furthermore, a size of the ESL type TFT is relatively great, affecting an aperture ratio of display panels. As to the BCE type TFT, channels thereof are damaged during an etching process, leading to poor performance and bad stability of devices, which affects a yield rate and reliability of display panels.

As shown in FIG. 1, a structural schematic view showing a related art array substrate is provided. The array substrate includes a substrate 101, an active layer 102, a gate 103, a gate insulating layer 104, a source 105, a drain 106, and an etch stopper layer 107. The active layer 102 includes a source contact part 1021, a drain contact part 1022, and a channel part 1023. The channel part 1023 overlaps the etch stopper layer 107. An effective channel length of oxide TFTs is a length L1 of the channel part 1023. Because the length L1 of the channel part 1023 is relatively great, a size of the TFTs cannot be reduced, which affects an aperture ratio of panels.

In conclusion, conventional display panels have an issue of low aperture rate due to oxide TFTs having a relatively great size. As such, it is necessary to provide an array substrate and a display panel to solve this defect.

SUMMARY

Embodiments of the present disclosure provide an array substrate and a display panel. A size of oxide TFTs is reduced to increase an aperture ratio of the display panel.

An embodiment of the present disclosure provides an array substrate, comprising:
   a substrate;
   an active layer disposed on the substrate, wherein material of the active layer comprises a metal oxide; and
   an ion injection stopper layer disposed on a side of the active layer away from the substrate;

wherein the active layer comprises a channel part, and the ion injection stopper layer corresponds to at least part of the channel part.

According to one embodiment of the present disclosure, the array substrate comprises:
   a gate disposed on the substrate; and
   a gate insulating layer disposed between the gate and the active layer;
   wherein an orthographic projection of the gate on the active layer covers the channel part.

According to one embodiment of the present disclosure, the array substrate comprises a source and a drain, the active layer comprises a source contact part and a drain contact part, the source is connected to the source contact part and covers the source contact part, and the drain is connected to the drain contact part and covers the drain contact part; and
   wherein an orthographic projection of the gate on the active layer covers the source contact part and the drain contact part.

According to one embodiment of the present disclosure, the active layer comprises a conductive part, and the ion injection stopper layer is spaced apart from the conductive part; and
   an ion doping concentration of the channel part, an ion doping concentration of the source contact part, and an ion doping concentration of the drain contact part are less than an ion doping concentration of the conductive part.

According to one embodiment of the present disclosure, the array substrate comprises an etch stopper layer disposed between the active layer and the ion injection stopper layer.

According to one embodiment of the present disclosure, the ion injection stopper layer is disposed between the source and the drain, and is spaced apart from the source and the drain; and
   the channel part comprises a main channel part corresponding to the ion injection stopper layer, and the conductive part is disposed on two opposite sides of the main channel part and is connected to the main channel part.

According to one embodiment of the present disclosure, the source comprises a main body part and an extension part, the main body part is connected to the corresponding source contact part and covers the corresponding source contact part, and the extension part is connected to the main body part and extends to the etch stopper layer; and/or
   the drain comprises a main body part and an extension part, the main body part is connected to the corresponding drain contact part and covers the corresponding drain contact part, and the extension part is connected to the main body part and extends to the etch stopper layer.

According to one embodiment of the present disclosure, the channel part comprises a secondary channel part corresponding to the extension part, and two opposite sides of the secondary channel part are respectively connected to one of the source contact part or the drain contact part and the conductive part.

According to one embodiment of the present disclosure, the array substrate comprises a passivation protection layer, and the passivation protection layer covers the source, the drain, and the active layer; and
   wherein the ion injection stopper layer is disposed on a side of the passivation protection layer away from the active layer.

According to one embodiment of the present disclosure, the ion injection stopper layer is disposed on the passivation protection layer, an orthographic projection of the ion injection stopper layer on the active is located between an orthographic projection of the source and an orthographic projection of the drain on the active layer, and is spaced apart from the source and the drain.

According to one embodiment of the present disclosure, the ion injection stopper layer, the source, and the drain are disposed on a same layer, and the ion injection stopper layer, the source, and the drain have a same material.

An embodiment of the present disclosure further provides a display panel, comprising an array substrate, an opposing substrate, and a liquid crystal layer disposed between the array substrate and the opposing substrate, wherein the array substrate comprises:

a substrate;

an active layer disposed on the substrate, wherein material of the active layer comprises a metal oxide; and an ion injection stopper layer disposed on a side of the active layer away from the substrate;

wherein the active layer comprises a channel part, and the ion injection stopper layer corresponds to at least part of the channel part.

According to one embodiment of the present disclosure, the array substrate comprises:

a gate disposed on the substrate; and a gate insulating layer disposed between the gate and the active layer;

wherein an orthographic projection of the gate on the active layer covers the channel part.

According to one embodiment of the present disclosure, the array substrate comprises a source and a drain, the active layer comprises a source contact part and a drain contact part, the source is connected to the source contact part and covers the source contact part, and the drain is connected to the drain contact part and covers the drain contact part; and wherein an orthographic projection of the gate on the active layer covers the source contact part and the drain contact part.

According to one embodiment of the present disclosure, the active layer comprises a conductive part, and the ion injection stopper layer is spaced apart from the conductive part; and an ion doping concentration of the channel part, an ion doping concentration of the source contact part, and an ion doping concentration of the drain contact part are less than an ion doping concentration of the conductive part.

According to one embodiment of the present disclosure, the array substrate comprises an etch stopper layer disposed between the active layer and the ion injection stopper layer.

According to one embodiment of the present disclosure, the ion injection stopper layer is disposed between the source and the drain, and is spaced apart from the source and the drain; and the channel part comprises a main channel part corresponding to the ion injection stopper layer, and the conductive part is disposed on two opposite sides of the main channel part and is connected to the main channel part.

According to one embodiment of the present disclosure, the source comprises a main body part and an extension part, the main body part is connected to the corresponding source contact part and covers the corresponding source contact part, and the extension part is connected to the main body part and extends to the etch stopper layer; and/or the drain comprises a main body part and an extension part, the main body part is connected to the corresponding drain contact part and covers the corresponding drain contact part, and the extension part is connected to the main body part and extends to the etch stopper layer.

According to one embodiment of the present disclosure, the channel part comprises a secondary channel part corresponding to the extension part, and two opposite sides of the secondary channel part are respectively connected to one of the source contact part or the drain contact part and the conductive part.

According to one embodiment of the present disclosure, the array substrate comprises a passivation protection layer, and the passivation protection layer covers the source, the drain, and the active layer; and wherein the ion injection stopper layer is disposed on a side of the passivation protection layer away from the active layer.

Regarding beneficial effects:

embodiments of the present disclosure provide an array substrate and a display panel. The display panel includes the array substrate. The array substrate includes an active layer and an ion injection stopper layer. Material of the active layer includes a metal oxide. The ion injection stopper layer is disposed on a side of the active layer. The active layer includes a channel part. By making the ion injection stopper layer correspond to at least part of the channel part, the ion injection stopper layer can block ions from being injected the channel part during an ion injection process, thereby reducing an effective channel length of oxide TFTs. A width of channels of the oxide TFTs can be reduced without changing a width-length ratio of the oxide TFTs. Thus, a size of the oxide TFTs can be reduced, and therefore an aperture ratio of the display panel can be increased.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DETAILED DESCRIPTION

Figure 1:
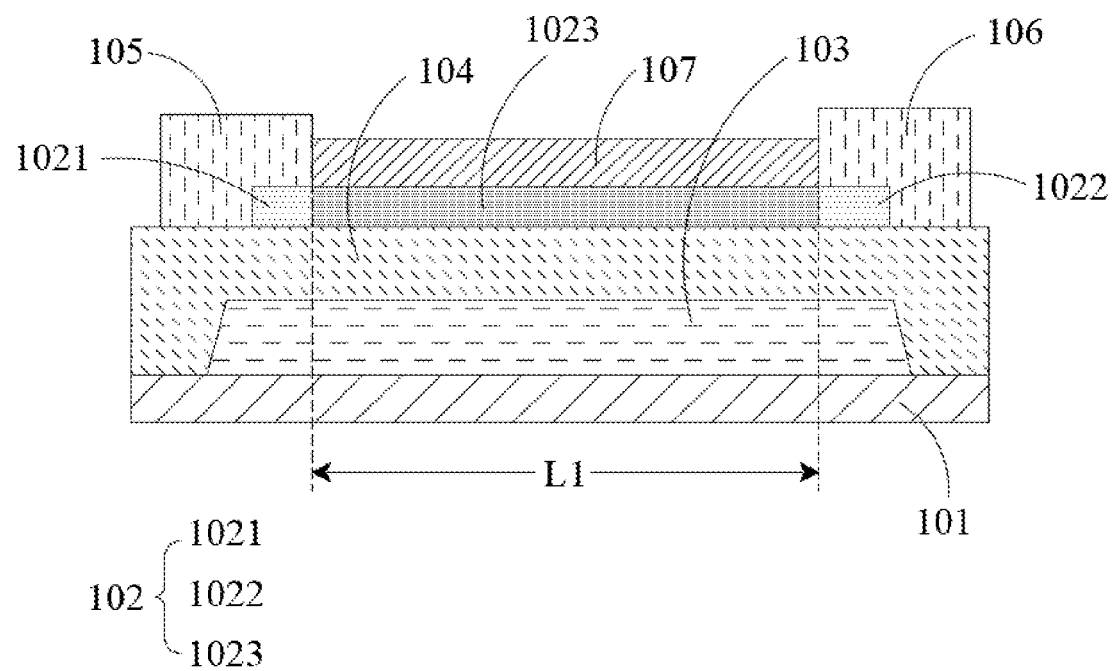
FIG. 1 is a structural schematic view showing a related art array substrate.

The following description of the various embodiments is provided with reference to the accompanying drawings to demonstrate the embodiments of the present disclosure. It should be understood that terms such as "upper," "lower," "front," "rear," "left," "right," "inside," "outside," "lateral" as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In the drawings, the identical or similar reference numerals constantly denote the identical or similar elements or elements having the identical or similar functions.

The present disclosure is further described in conjunction with drawings and specific embodiments.

Figure 2:
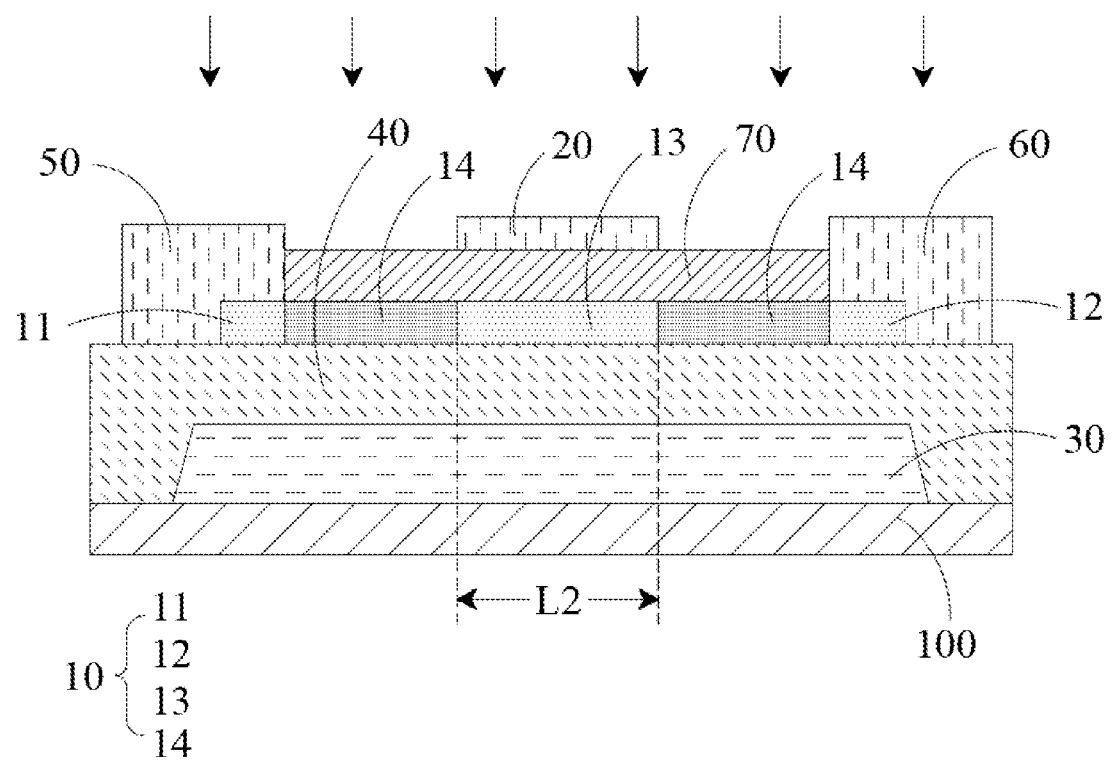
FIG. 2 is a structural schematic view showing a first array substrate provided by an embodiment of the present disclosure.

Therefore, the present disclosure provides an array substrate. As shown in FIG. 2, a structural schematic view showing a first array substrate provided by an embodiment of the present disclosure is provided. The array substrate includes a substrate 100, and an active layer 10 and an ion injection stopper layer 20 stacked on the substrate 100. The ion injection stopper layer 20 is disposed on a side of the active layer 10.

Material of the active layer 10 includes a metal oxide which can be any one of indium gallium zinc oxide (IGZO), indium tin zinc oxide (ITZO), or others.

The active layer 10 includes a source contact part 11, a drain contact part 12, a channel part 13, and a conductive part 14. The channel part 13 and the conductive part 14 are disposed between the source contact part 11 and the drain contact part 12.

The ion injection stopper layer 20 corresponds to the channel part 13, thereby making an orthographic projection of the ion injection stopper layer 20 on the active layer 10 overlap the channel part 13. The ion injection stopper layer 20 is spaced apart from the conductive part 14, thereby making the orthographic projection of the ion injection stopper layer 20 on the active layer 10 spaced apart from the conductive part 14. Therefore, the conductive part 14 is prevented from being blocked by the ion injection stopper layer 20.

In the present embodiment, material of the ion injection stopper layer 20 includes metal. During an ion injection process, ions cannot pass through the ion injection layer 20, thereby ensuring that the channel part 13 of the active layer 10 corresponding to the ion injection layer 20 retains its semiconductor properties.

It should be noted that a side of the active layer 10 provided with the ion injection stopper layer 20 is an ion injection direction. During actual processes of manufacturing oxide TFTs, an ion injection process can be performed on the active layer 10 after the active layer 10 and the ion injection stopper layer 20 are sequentially formed. The ion injection stopper layer 20 can block the channel part 13 of the active layer 10 to prevent ions from being injected into the channel part 13, thereby retaining semiconductor properties of the channel part 13. In the active layer 10, the conductive layer 14, to which ions are injected, is formed on an area not blocked by the ion injection barrier part 13 or other metal material. An ion doping concentration of the conductive part 14 is greater than an ion doping concentration of the channel part 13.

In conventional technologies, as shown in FIG. 1, only a channel part 1023 is defined between a source contact part 1021 and a drain contact part 1022. In the array substrate provided by the present embodiment, not only the channel part 13 but also the conductive part 14 are defined between the source contact part 11 and the drain contact part 12. When a length of a channel of the active layer 10 remains unchanged, a length L2 of the channel part 13 is an effective channel length of oxide TFTs. According to FIG. 1 and FIG. 2, the length L2 of the channel part 13 as shown in FIG. 2 is less than the length L1 of the channel part 1023 as shown in FIG. 1. Therefore, by defining the conductive part 14 between the source contact part 11 and the drain contact part 12, an effective channel length of oxide TFTs can be reduced.

An on-site current of oxide TFTs is proportional to a width and a length of a channel of the oxide TFTs. When an on-site current and a width-length ratio of a channel are unchanged, if an effective channel length of oxide TFTs is reduced, a width of a corresponding channel can be reduced as well. Therefore, a size of the oxide TFTs can be reduced, and an aperture ratio of display panels having the oxide TFTs can be increased. In addition, the channel part 13 of the active layer 10 is disposed below the ion injection stopper layer 20. As such, the channel part of the active layer can be prevented from being affected by light, $H_2O$, H, and $O_2$ in an ambient environment during sequential processes. Thus, stability of the oxide TFTs can be improved.

As shown in FIG. 2, the array substrate further includes a gate 30 and a gate insulating layer 40. The gate 30 is disposed on a side of the active layer 10 away from the ion injection stopper layer 20. The gate insulating layer 40 is disposed between the gate 30 and the active layer 10. An orthographic projection of the gate 30 on the active layer 10 covers the channel part 13 and the conductive part 14.

The array substrate further includes a source 50 and a drain 60. The source 50 is connected to the source contact part 11 and covers a side of the source contact part 11 away from the gate insulating layer 40. The drain 60 is connected to the drain contact part 12 and covers a side of the drain contact part 12 away from the gate insulating layer 40. The orthographic projection of the gate 30 on the active layer 10 covers the source contact part 11 and the drain contact part 12.

It should be noted that the source contact part 11 and the drain contact part 12 are covered by metal material. Therefore, ions are not injected into the source contact part 11 and the drain contact part 12 after the source 50 and the drain 60 are formed during an ion injection process. An ion doping concentration of the source contact part 11 and an ion doping concentration of the drain contact part 12 are less than an ion doping concentration of the conductive part 14, thereby retaining semiconductor properties of the source contact part 11 and the drain contact part 12. By making the gate 30 overlap the source contact part 11 and the drain contact part 12 in a thickness direction of the gate 30, when the gate 30 reaches a threshold voltage, the source contact part 11, the drain contact part 12, and the channel part 13 are changed to be conductive. Therefore, the source 50 can be conductive to the drain 60.

Furthermore, the array substrate further includes an etch stopper layer 70. The etch stopper layer 70 is disposed between the active layer 10 and the ion injection stopper layer 20.

As shown in FIG. 2, the oxide TFTs are ESL type TFTs. The etch stopper layer 70 covers the channel part 13 and the conductive part 14 of the active layer 10. In practical manufacturing processes, the etch barrier layer 70 is formed before the source 50 and the drain 60 are formed. The active layer 10 is protected by the etch barrier layer 70. Therefore, etchants used to form the source 50 and the drain 60 are prevented from damaging the active layer 10, thereby ensuring electric performance of the active layer 10.

Specifically, material of the etch stopper layer 70 includes one or more of silicon oxide, silicon nitride, silicon oxynitride, and aluminum oxide.

According to the embodiment as shown in FIG. 2, the ion injection stopper layer 20 is disposed on a side of the etch stopper layer 70 away from the active layer 10. The ion injection stopper layer 20 is disposed a middle area between the source 50 and the drain 60, and is spaced apart from the source 50 and the drain 60.

The channel part 13 corresponds to the ion injection stopper layer 20. The conductive part 14 is disposed on two opposite sides of the channel part 13. The conductive part 14 is spaced apart from the ion injection stopper layer 20, and is not blocked by the ion injection stopper layer 20. The conductive part 14 disposed on a left side of the channel part 13 is connected to the source contact part 11 and the channel part 13. The conductive part 14 disposed on a right side of the conductive part 14 is connected to the drain contact part 12 and the channel part 13.

In other embodiments, the ion injection barrier layer 20 may also be disposed on other areas between the source 50 and the drain 60, and is spaced apart from the source 50 and the drain 60. The channel part 13 corresponds to the ion injection stopper layer 20.

Figure 3:
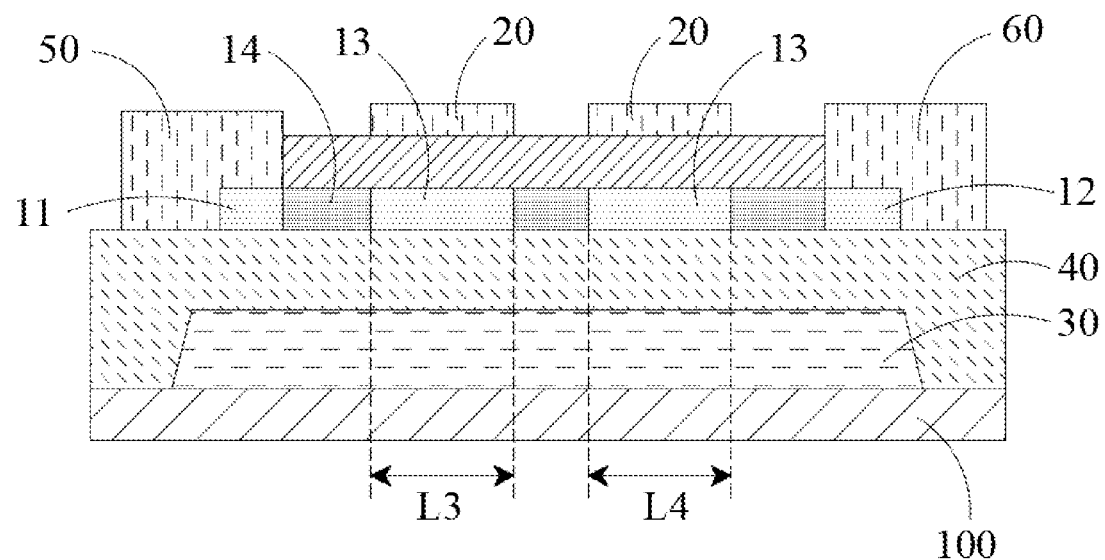
FIG. 3 is a structural schematic view showing a second array substrate provided by an embodiment of the present disclosure.

As shown in FIG. 3, a structural schematic view showing a second array substrate provided by an embodiment of the present disclosure is provided. A structure of the second array substrate and the structure of the first array substrate are basically a same. Differences therebetween are: the oxide TFTs include multiple ion injection stopper layers 20. The ion injection stopper layers 20 are disposed between the source 50 and the drain 60, and are spaced apart from the source 50 and the drain 60. The ion injection stopper layers 20 are spaced apart from each other.

The active layer 10 includes multiple channel parts 13. The channel parts 13 corresponds to the ion injection stopper layers 20 in a one-to-one correspondence. The conductive layer 14 is disposed on areas between the channel parts 13 not covered by the ion injection stopper layers 20. An effective channel length is a sum of a length L3 and a length L4 which are lengths of two channel parts 13. In practical applications, a number of the ion injection stopper layers 20 disposed between the source 50 and the drain 60 is not limited to one, and may also be two, three, or more.

Figure 4:
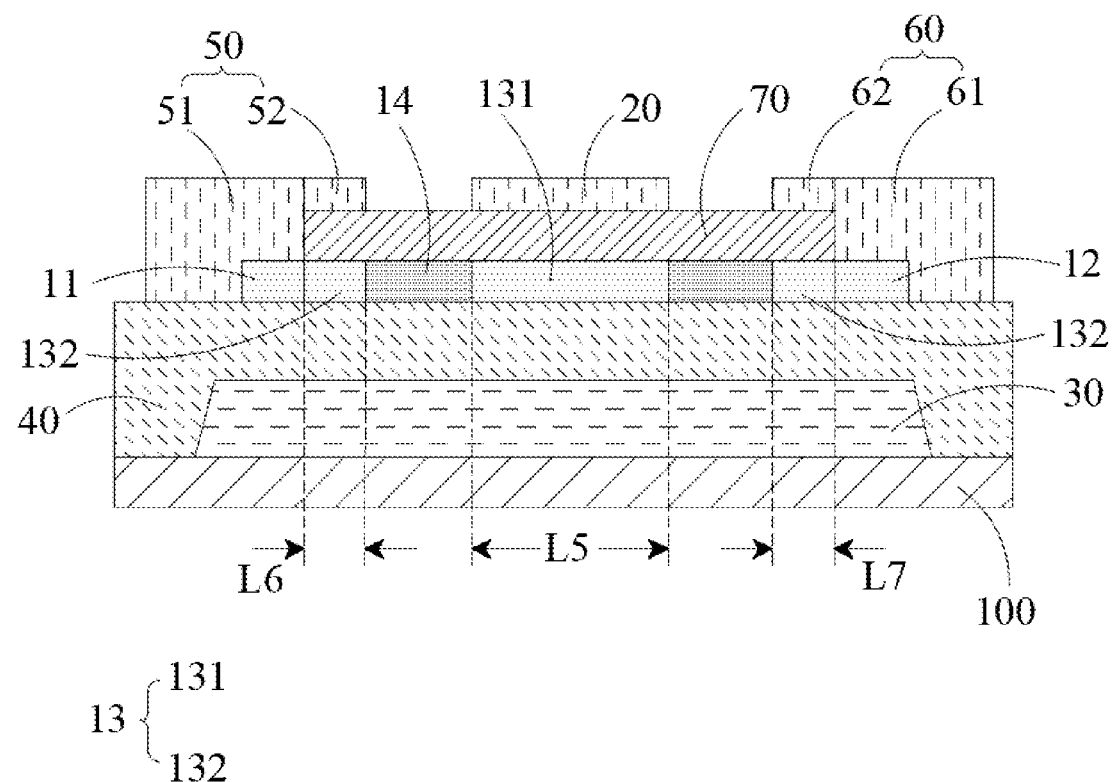
FIG. 4 is a structural schematic view showing a third array substrate provided by an embodiment of the present disclosure.

As shown in FIG. 4, a structural schematic view showing a third array substrate provided by an embodiment of the present disclosure is provided. A structure of the third array substrate and the structure of the first array substrate as shown in FIG. 2 are basically a same. Differences therebetween are: the source 50 includes a main body part and an extension part. The main body part is connected to the corresponding source contact part 11 and covers the corresponding source contact part 11. The extension part is connected to the main body part and extends to the etch stopper layer 70, and/or drain 60 includes a main body part and an extension part, the main body part is connected to the corresponding drain contact part 12 and covers the corresponding drain contact part 12, and the extension part is connected to the main body part and extends to the etch stopper layer 70.

The channel part 13 includes a secondary channel part corresponding to the extension part. Two opposite sides of the secondary channel part are respectively connected to one of the source contact part 11 or the drain contact part 12 and the conductive part 14.

In one embodiment, as shown in FIG. 4, the channel part 13 includes a main channel part 131 corresponding to the ion injection stopper layer. The conductive part 14 is disposed on two opposite sides of the main channel part 131 and is connected to the main channel part 131.

The source 50 includes a main source body part 51 covering and connected to the source contact part 11, and a source extension part 52 extending from the main source body part 51 to the etch stopper layer 70. The drain 60 includes a main drain body part 61 covering and connected to the drain contact part 12, and a drain extension part 62 extending from the main drain body part 61 to the etch stopper layer 70.

The channel part 13 includes two secondary channel parts 132. The two secondary channel parts 132 respectively correspond to the source extension part 52 and the drain extension part 62. Two sides of one of the secondary channel parts 132 are respectively connected to the source contact part 11 and the conductive part 14 close to the source contact part 11. Two sides of the other one of the secondary channel parts 132 are respectively connected to the drain contact part 12 and the conductive part 14 close to the drain contact part 12.

In the embodiment as shown in FIG. 4, an effective channel length L of oxide TFTs is a sum of a length L5 of the main channel part 131 and a length L6 and a length L7 of the secondary channel parts 132 disposed on two sides of the main channel part 131. Compared with the array substrate as shown in FIG. 1, an effective channel length of the oxide TFTs of the third array substrate as shown in FIG. 4 can also be reduced by disposing the ion injection stopper layer 20, the source extension part 52, and the drain extension part 62.

Figure 5:
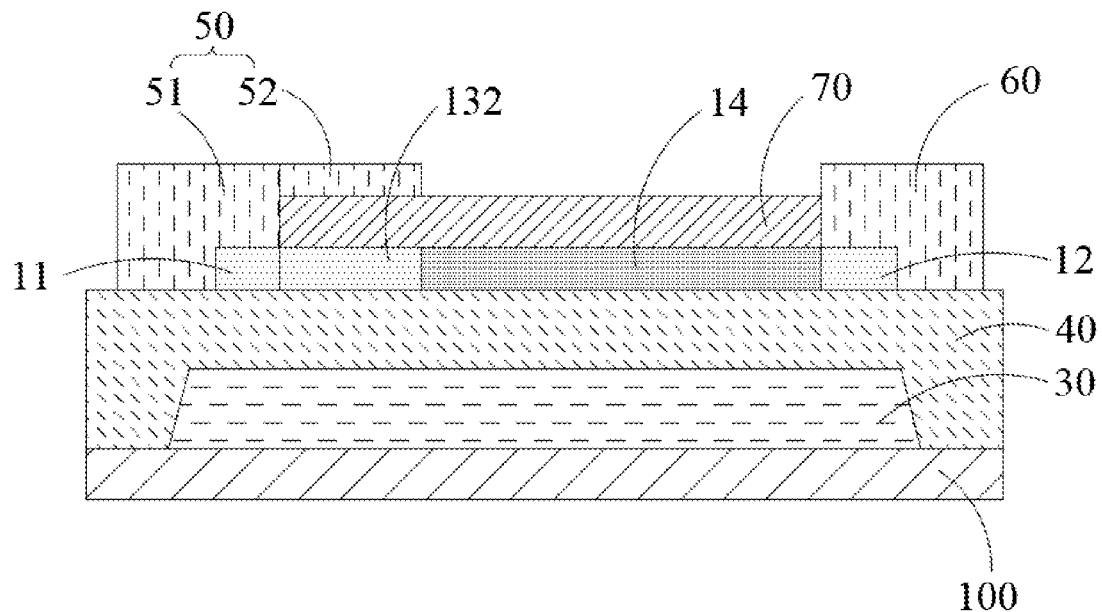
FIG. 5 is a structural schematic view showing a fourth array substrate provided by an embodiment of the present disclosure.

In one embodiment, as shown in FIG. 5, a structural schematic view of a fourth array substrate provided by an embodiment of the present disclosure is provided. A structure of the fourth array substrate and the structure of the third array substrate as shown in FIG. 4 are basically a same. Differences therebetween are: the array substrate is not provided with the ion injection stopper layer 20. The source extension part 52 extending from the main source body part 51 to the etch stopper layer 70 is disposed on the source 50. The channel part 13 only includes one secondary channel part 132. The secondary channel part 132 corresponds to the source extension part 52. Two opposite sides of the secondary channel part 132 are connected to the source contact part 11 and the conductive part 14.

Figure 6:
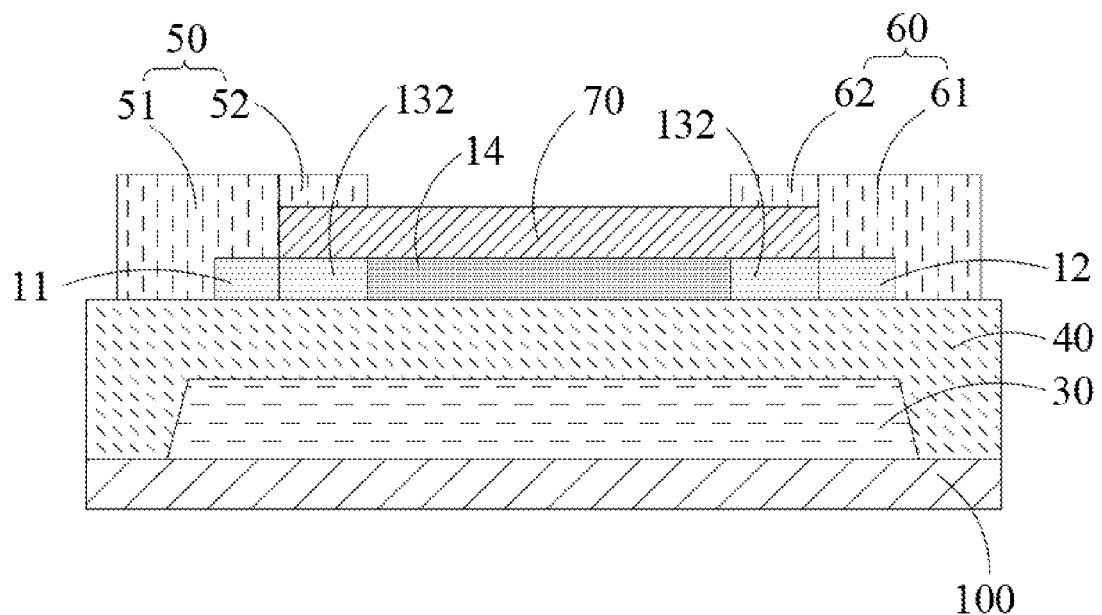
FIG. 6 is a structural schematic view showing a fifth array substrate provided by an embodiment of the present disclosure.

In one embodiment, as shown in FIG. 6, a structural schematic view of an array substrate provided by an embodiment of the present disclosure is provided. A structure of the array substrate of the present embodiment and the structure of the fourth array substrate as shown in FIG. 5 are basically a same. Differences therebetween are: the source 50 includes the main source body part 51 covering and connected to the source contact part 11, and the source extension part 52 extending from the main source body part 51 to the etch stopper layer 70; the drain 60 includes the main drain body part 61 covering and connected to the drain contact part 12, and the drain extension part 62 extending from the main source body part 61 to the etch stopper layer 70. The channel part 13 only includes two secondary channel parts 132 respectively correspond to the source extension part 52 and the drain extension part 62. The two secondary channel parts 132 are respectively connected to the source contact part 11 and the drain contact part 12. The conductive part 14 is disposed between the two secondary channel parts 132, and is connected to the two secondary channel parts 132.

In embodiments as shown in FIGS. 2 to 6, material of the ion injection stopper layer 20 may be a same as material of the source 50 and material of the drain 60. In manufacturing processes of the array substrate, the ion injection stopper layer 20, the source 50, and the drain 60 can be simultaneously formed by a same metal film forming process. As such, one mask process required for forming the ion injection stopper layer 20 can be saved, thereby saving manufacturing cost.

Figure 7:
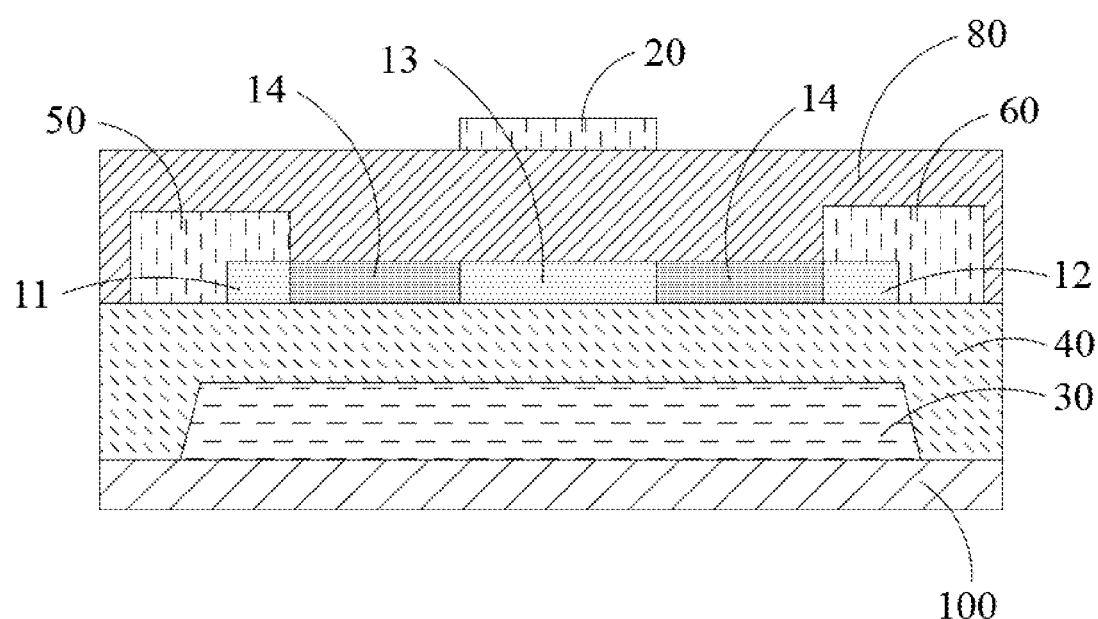
FIG. 7 is a structural schematic view showing a sixth array substrate provided by an embodiment of the present disclosure.

In one embodiment, the oxide TFTs may also be BCE type TFTs. As shown in FIG. 7, a structural schematic view showing a sixth array substrate provided by an embodiment of the present disclosure is provided. Each of the oxide TFTs includes a gate 30, a gate insulating layer 40, an active layer 10, a source 50, a drain 60, a passivation protection layer 80, and an ion injection stopper layer 20. The passivation protection layer 80 covers the source 50, the drain 60, and the active layer 10. The ion injection stopper layer 20 is disposed on a side of the passivation protection layer 80 away from the active layer 10.

Material of the passivation protection layer 80 includes one or more of silicon oxide, silicon nitride, silicon oxynitride, and aluminum oxide.

An orthographic projection of the ion injection stopper layer 20 on the active layer 10 is located between an orthographic projection of the source 50 and an orthographic projection of the drain 60 on the active layer 10, and is spaced apart from the source 50 and the drain 60.

The active layer 10 includes a channel part 13, a conductive part 14, a source contact part 11, and a drain contact part 12. The channel part 13 corresponds to the ion injection stopper layer 20. The conductive part 14 is spaced apart from the ion injection stopper layer 20.

The source 50 is connected to the source contact part 11 and covers a side of the source contact part 11 away from the gate insulating layer 40. The drain 60 is connected to the drain contact part 12 and covers a side of the drain contact part 12 away from the gate insulating layer 40. Two conductive parts 14 are respectively disposed between the source contact part 11 and the channel part 13 and between the drain contact part 12 and the channel part 13. A length of the channel part 13 is an effective channel length of oxide TFTs.

Based on the array substrate provided by the above embodiments, an embodiment of the present disclosure further provides a display panel. The display panel is a liquid crystal display (LCD) panel. The display panel includes an array substrate and an opposing substrate opposite to each other, and a liquid crystal layer disposed between the array substrate and the opposing substrate. The opposing substrate may be a color filter substrate. The array substrate may be the array substrate provided by the above embodiments.

In practical applications, a type of the display panel is not limited to the LCD panel of the above embodiment, and may also be an organic light-emitting diode (OLED) display panel or a micro light-emitting diode (Micro-LED) display panel. The display panel may also include a luminescent device layer disposed on the array substrate provided by the above embodiments. The luminescent device layer may include a plurality of light-emitting devices such as Micro-LEDs or Mini-LEDs.

By disposing the ion injection stopper layer in the oxide TFTs of the array substrate, a size of the oxide TFTs can be reduced, thereby increasing an on-site current of the oxide TFTs. In addition, stability of the oxide TFTs can be increased. Situations of insufficient charging of LCD display panels or insufficient brightness of Mini-LEDs and Micro-LEDs are prevented.

Based on the display panel provided by the above embodiment, an embodiment of the present disclosure further provides an electronic device. The electronic device includes the display panel provided by the above embodiment. The electronic device may be a mobile terminal such as a color e-paper, a color e-book, or a smartphone. The electronic device may also be a wearable terminal device such as a smartwatch or a smart wristband. The electronic device may also be a fixed terminal such as a colorful electronic billboard or a colorful electronic poster.

Regarding beneficial effects of embodiment of the present disclosure: embodiments of the present disclosure provide an array substrate and a display panel. The display panel includes the array substrate. The array substrate includes an active layer and an ion injection stopper layer. Material of the active layer includes a metal oxide. The ion injection stopper layer is disposed on a side of the active layer. The active layer includes a channel part. By making the ion injection stopper layer correspond to at least part of the channel part, the ion injection stopper layer can block ions from being injected into the channel part during an ion injection process, thereby reducing an effective channel length of oxide TFTs. A width of channels of the oxide TFTs can be reduced without changing a width-length ratio of the oxide TFTs. Thus, a size of the oxide TFTs can be reduced, and therefore an aperture ratio of the display panel can be increased. In addition, the channel part of the active layer is disposed below the ion injection stopper layer. As such, the channel part of the active layer can be prevented from being affected by light, $H_2O$, H, and $O_2$ in an ambient environment during sequential processes. Thus, stability of the oxide TFTs can be improved.

In summary, the present disclosure has been described with preferred embodiments thereof. The preferred embodiments are not intended to limit the present disclosure, and it is understood that many changes and modifications to the described embodiments can be carried out without departing from the scope and the spirit of the disclosure that is intended to be limited only by the appended claims.

What is claimed is:

1. An array substrate, comprising:
   a substrate;
   an active layer disposed on the substrate, wherein material of the active layer comprises a metal oxide; and
   an ion injection stopper layer disposed on a side of the active layer away from the substrate;
   wherein the active layer comprises a channel part, and the ion injection stopper layer corresponds to at least part of the channel part;
   wherein the array substrate comprises:
   a gate disposed on the substrate; and
   a gate insulating layer disposed between the gate and the active layer; and
   wherein an orthographic projection of the gate on the active layer covers the channel part;
   wherein the array substrate comprises a source and a drain, the active layer comprises a source contact part and a drain contact part, the source is connected to the source contact part and covers the source contact part, and the drain is connected to the drain contact part and covers the drain contact part; and wherein an orthographic projection of the gate on the active layer covers the source contact part and the drain contact part;

wherein the active layer comprises a conductive part, and the ion injection stopper layer is spaced apart from the conductive part; and an ion doping concentration of the channel part, an ion doping concentration of the source contact part, and an ion doping concentration of the drain contact part are less than an ion doping concentration of the conductive part;

wherein the array substrate comprises an etch stopper layer disposed between the active layer and the ion injection stopper layer.

2. The array substrate of claim 1, wherein the ion injection stopper layer is disposed between the source and the drain, and is spaced apart from the source and the drain; and the channel part comprises a main channel part corresponding to the ion injection stopper layer, and the conductive part is disposed on two opposite sides of the main channel part and is connected to the main channel part.

3. The array substrate of claim 2, wherein the source comprises a main body part and an extension part, the main body part is connected to the corresponding source contact part and covers the corresponding source contact part, and the extension part is connected to the main body part and extends to the etch stopper layer; or the drain comprises a main body part and an extension part, the main body part is connected to the corresponding drain contact part and covers the corresponding drain contact part, and the extension part is connected to the main body part and extends to the etch stopper layer.

4. The array substrate of claim 3, wherein the channel part comprises a secondary channel part corresponding to the extension part, and two opposite sides of the secondary channel part are respectively connected to one of the source contact part or the drain contact part and the conductive part.

5. The array substrate of claim 1, wherein the array substrate comprises a passivation protection layer, and the passivation protection layer covers the source, the drain, and the active layer; and wherein the ion injection stopper layer is disposed on a side of the passivation protection layer away from the active layer.

6. The array substrate of claim 5, wherein the ion injection stopper layer is disposed on the passivation protection layer, an orthographic projection of the ion injection stopper layer on the active is located between an orthographic projection of the source and an orthographic projection of the drain on the active layer, and is spaced apart from the source and the drain.

7. The array substrate of claim 6, wherein the ion injection stopper layer, the source, and the drain are disposed on a same layer, and the ion injection stopper layer, the source, and the drain have a same material.

8. A display panel, comprising an array substrate, an opposing substrate, and a liquid crystal layer disposed between the array substrate and the opposing substrate, wherein the array substrate comprises:

a substrate;
an active layer disposed on the substrate, wherein material of the active layer comprises a metal oxide; and
an ion injection stopper layer disposed on a side of the active layer away from the substrate;

wherein the active layer comprises a channel part, and the ion injection stopper layer corresponds to at least part of the channel part;

wherein the array substrate comprises:
a gate disposed on the substrate; and
a gate insulating layer disposed between the gate and the active layer;

wherein an orthographic projection of the gate on the active layer covers the channel part wherein the array substrate comprises a source and a drain, the active layer comprises a source contact part and a drain contact part, the source is connected to the source contact part and covers the source contact part, and the drain is connected to the drain contact part and covers the drain contact part; and wherein an orthographic projection of the gate on the active layer covers the source contact part and the drain contact part;

wherein the active layer comprises a conductive part, and the ion injection stopper layer is spaced apart from the conductive part; and an ion doping concentration of the channel part, an ion doping concentration of the source contact part, and an ion doping concentration of the drain contact part are less than an ion doping concentration of the conductive part;

wherein the array substrate comprises an etch stopper layer disposed between the active layer and the ion injection stopper layer.

9. The display panel of claim 8, wherein the ion injection stopper layer is disposed between the source and the drain, and is spaced apart from the source and the drain; and the channel part comprises a main channel part corresponding to the ion injection stopper layer, and the conductive part is disposed on two opposite sides of the main channel part and is connected to the main channel part.

10. The display panel of claim 9, wherein the source comprises a main body part and an extension part, the main body part is connected to the corresponding source contact part and covers the corresponding source contact part, and the extension part is connected to the main body part and extends to the etch stopper layer; or the drain comprises a main body part and an extension part, the main body part is connected to the corresponding drain contact part and covers the corresponding drain contact part, and the extension part is connected to the main body part and extends to the etch stopper layer.

11. The display panel of claim 10, wherein the channel part comprises a secondary channel part corresponding to the extension part, and two opposite sides of the secondary channel part are respectively connected to one of the source contact part or the drain contact part and the conductive part.

12. The display panel of claim 8, wherein the array substrate comprises a passivation protection layer, and the passivation protection layer covers the source, the drain, and the active layer; and wherein the ion injection stopper layer is disposed on a side of the passivation protection layer away from the active layer.

13. An array substrate, comprising:
a substrate;
an active layer disposed on the substrate, wherein material of the active layer comprises a metal oxide; and
an ion injection stopper layer disposed on a side of the active layer away from the substrate;

wherein the active layer comprises a channel part, and the ion injection stopper layer corresponds to at least part of the channel part;

wherein the array substrate comprises:

a gate disposed on the substrate; and a gate insulating layer disposed between the gate and the active layer; and wherein an orthographic projection of the gate on the active layer covers the channel part;

wherein the array substrate comprises a source and a drain, the active layer comprises a source contact part and a drain contact part, the source is connected to the source contact part and covers the source contact part, and the drain is connected to the drain contact part and covers the drain contact part; and wherein an orthographic projection of the gate on the active layer covers the source contact part and the drain contact part;

wherein the active layer comprises a conductive part, and the ion injection stopper layer is spaced apart from the conductive part; and an ion doping concentration of the channel part, an ion doping concentration of the source contact part, and an ion doping concentration of the drain contact part are less than an ion doping concentration of the conductive part;

wherein the array substrate comprises a passivation protection layer, and the passivation protection layer covers the source, the drain, and the active layer; and wherein the ion injection stopper layer is disposed on a side of the passivation protection layer away from the active layer.

* * * * *